United States Patent
Endo

(10) Patent No.: US 7,507,691 B2
(45) Date of Patent: *Mar. 24, 2009

(54) BISMUTH BASED OXIDE SUPERCONDUCTOR THIN FILMS AND METHOD OF MANUFACTURING THE SAME

(75) Inventor: Kazuhiro Endo, Tsukuba (JP)

(73) Assignee: National Institute of Advanced Industrial Science and Technology (JP)

( * ) Notice: Subject to any disclaimer, the term of this patent is extended or adjusted under 35 U.S.C. 154(b) by 505 days.

This patent is subject to a terminal disclaimer.

(21) Appl. No.: 11/228,787

(22) Filed: Sep. 16, 2005

(65) Prior Publication Data

US 2006/0084578 A1   Apr. 20, 2006

(30) Foreign Application Priority Data

Sep. 21, 2004   (JP) .............................. 2004-273999
Mar. 25, 2005   (JP) .............................. 2005-090130

(51) Int. Cl.
  *H01L 39/12* (2006.01)
  *B05D 5/12* (2006.01)
(52) U.S. Cl. .................. 505/238; 505/239; 505/473; 427/62
(58) Field of Classification Search .............. 505/238, 505/239, 729, 473; 117/63, 944, 101, 902; 427/62
See application file for complete search history.

(56) References Cited

U.S. PATENT DOCUMENTS

| 4,996,185 | A | * | 2/1991 | Fujimori et al. ............. 505/126 |
| 5,055,445 | A | * | 10/1991 | Belt et al. ................... 505/452 |
| 5,110,790 | A | * | 5/1992 | Feenstra et al. ............. 505/238 |
| 5,206,214 | A | * | 4/1993 | Fujimori et al. ............. 505/475 |
| 5,244,873 | A | * | 9/1993 | Hattori et al. ................ 505/475 |
| 5,413,986 | A | * | 5/1995 | Nakamura ................... 505/476 |
| 5,602,080 | A | * | 2/1997 | Bednorz et al. ............. 505/451 |
| 5,691,279 | A | * | 11/1997 | Tauber et al. ............... 505/239 |
| 6,074,768 | A | * | 6/2000 | Matsunaga et al. ......... 428/700 |

FOREIGN PATENT DOCUMENTS

JP    05-007027    1/1993
JP    09-246611    9/1997

OTHER PUBLICATIONS

Kula et al "Highly oriented Bi-based thin films . . . ", IEEE Transactions on Magnetics, vol. 27, No. 2, Mar. 1991 (pp. 1581-1584).*
Kleptsyn et al "High temperature superconducting thin films on CaGdAlO4 substrates", Journal of Crystal Growth 196 (1999) 122-125.*

* cited by examiner

*Primary Examiner*—Mark Kopec
(74) *Attorney, Agent, or Firm*—Ostrolenk, Faber, Gerb & Soffen, LLP

(57) ABSTRACT

A Bi-based oxide superconductor thin film whose c-axis is oriented parallel to the substrate and whose a-axis (or b-axis) is oriented perpendicular to the substrate, is manufactured in order to obtain a high performance layered Josephson junction using a Bi-based oxide superconductor. The method of manufacturing an a-axis oriented Bi-based oxide superconductor thin film, involves an epitaxial growth process using an $LaSrAlO_4$ single crystal substrate of a (110) plane or a $LaSrGaO_4$ single crystal substrate of a (110) plane, for which the lattice constant matches well with a (100) plane of a Bi-2223 oxide superconductor. By this method, rather than the normally easily obtained Bi-2212, an a-axis oriented film of Bi-2223 showing an extremely high superconductive transition temperature even for a Bi-based oxide superconductor can be selectively manufactured.

8 Claims, 5 Drawing Sheets

```
┌─────────────────────────────────┐
│                                 │
│     SUPERCONDUCTOR LAYER        │
│                                 │
├─────────────────────────────────┤
│                                 │
│        INSULATOR LAYER          │
│                                 │
├─────────────────────────────────┤
│                                 │
│     SUPERCONDUCTOR LAYER        │
│                                 │
└─────────────────────────────────┘
```

TEMPERATURE DEPENDENCE OF
A BI-2223 THIN FILM IN THE [001]
DIRECTION

TEMPERATURE DEPENDENCE OF
A BI-2223 THIN FILM IN THE [010]
DIRECTION

SUBSTRATE
ORIENTATION

FILM
ORIENTATION

BISMUTH BASED OXIDE SUPERCONDUCTOR THIN FILMS AND METHOD OF MANUFACTURING THE SAME

BACKGROUND OF THE INVENTION

Priority is claimed to Japanese Patent Application No. 2004-273999, filed Sep. 21, 2004, and Japanese Patent Application No. 2005-090130, filed in Mar. 25, 2005, which are incorporated herein by reference.

1. Field of the Invention

The present invention relates to an oxide superconductor with a c-axis oriented parallel to a substrate and an a-axis (or b-axis) oriented perpendicular to the substrate, especially to bismuth based (hereunder "Bi-based") oxide superconductor thin films, specifically $Bi_2Sr_2Ca_2Cu_3O_{10\pm X}$ (where X is a positive number less than unity, hereunder "Bi-2223") or $Bi_2Sr_2CuO_{6\pm Y}$ (where Y is a positive number less than unity, hereunder "Bi-2201"), in order to obtain a high performance layered Josephson junction using an oxide superconductor especially a Bi-based oxide superconductor, and a method of manufacturing the same.

2. Description of Related Art

A feature of a Josephson device, which uses a superconductor, is its high speed operation and low power consumption. When applied to an integrated circuit, it can perform high speed switching with little electric power. In addition to the high speed switching, the Josephson device shows a small heat production than a high density integrated circuit, in which heat production is a problem common to semiconductor devices. Therefore, it is expected that the Josephson device exhibits a higher speed operation performance compared to a semiconductor.

Conventionally, Nb metal or NbN was used as a superconductor in a Josephson device. However, because the superconductive transition temperature is low, the Josephson device was usually operated at a liquid helium temperature of 4.2K. Compared to this, since an oxide superconductor has a higher superconductive transition temperature, a Josephson device using an oxide superconductor can be operated at around a liquid nitrogen temperature, and thus be it is favorable in the view of resource and energy saving.

A superconductive device that shows the Josephson effect is called a Josephson junction. A Josephson junction, which is suitable for constituting an integrated circuit using superconductive devices, is favorable to be manufactured as a layered junction that has a very thin barrier layer of a normal conductor or an insulator inserted between two superconductive thin films as shown in FIG. 1, as it enables precise dimensional control and the manufacture of many junctions. In practice, a laminated junction is also being used as a Josephson junction in superconductive integrated circuits using Nb metal.

A problem that requires a breakthrough in order to realize manufacturing of a layered Josephson junction using an oxide superconductor, is closely related to the crystal structure of oxide superconductors. Yttrium based (hereunder "Y-based") oxide superconductors and Bi-based oxide superconductors have more remarkable anisotropy of superconductive characteristics such as coherence length, magnetic flux penetration depth, or critical current density, than for conventional superconductors such as Nb.

The crystals of these superconductors have orthorhombic lattice or tetragonal lattice structure, but the strength of the superconductive coupling in the c-axis direction is weaker than the coupling in the in-plane direction of a surface that is perpendicular to the c-axis. Superconductivity of an oxide superconductor is thought to occur in a CuO plane composed of a copper (Cu) atom and an oxygen (O) atom.

Therefore, the anisotropy of the superconductive coupling derives from the fact that the CuO plane is oriented perpendicular to a c-axis (namely, in the a- or b-axis direction), and not in the c-axis direction. Accordingly, the coherence length (the inter-electronic distance in which a superconducting electron pair is formed) which is closely related in a Josephson junction, is significantly shorter in the c-axis direction than in the a-axis direction. This tendency is more remarkable in a Bi-based superconductor, whose crystal structure has bigger anisotropy than that of a Y-based superconductor, and the coherence length in the c-axis direction is as short as 0.2 nm.

Thus, an oxide superconductor, especially a Bi-based superconductor such as Bi-2223 or Bi-2201 has extremely short coherence length in the c-axis direction. Therefore, in order to manufacture a Josephson junction layered in the c-axis direction using c-axis oriented films it is essential to form a flat and very thin barrier layer. However, in making a barrier layer very thin, a rough surface caused by deposit and so on becomes a problem, which makes it difficult to form a very thin uniform barrier layer, and which causes current leakage between superconductors sandwiching the barrier layer from each side. Therefore this type of Josephson junction has not been obtained yet. Moreover, even if the Josephson junction can be formed, the Josephson critical current density Jc and the Josephson characteristic parameter IcRn are small, and good characteristics may not be obtained.

Accordingly, in order to obtain a high performance layered Josephson junction using a Bi-based oxide superconductor, it is essential to manufacture a junction in the non c-axis direction in which the coherence length is longer than in the c-axis direction. Among these directions, the direction in which the coherence length is the longest is the a-axis (or b-axis) direction. Therefore, in order to obtain a high performance layered Josephson junction using a Bi-based oxide superconductor, it is preferable to manufacture a Bi-based oxide superconductor thin film whose c-axis is oriented parallel to the substrate and whose a-axis (or b-axis) is oriented perpendicular to the substrate.

As one of the methods to realize this, there is known (Japanese Unexamined Patent Application, First Publication No. Hei 5-7027) a method of manufacturing an oxide superconductor film comprising; a step for forming a composition modulated film composed of oxides on a substrate by supplying active oxygen and a part of the metallic components of a Bi-based oxide onto the substrate, and a step for forming an oxide superconductor thin film on the composition modulated film by supplying active oxygen and all of the metallic components of the Bi-based oxide. However, according to this method, the proportion of the c-axis that is parallel to the substrate varies depending on conditions, and it can not be said that a Bi-based oxide superconductor thin film of good quality can be obtained.

Another method is proposed (Japanese Unexamined Patent Application, First Publication No. Hei 9-246611) that a Josephson device using a Bi-based oxide superconductor thin film whose c-axis is oriented parallel to the substrate and whose a-axis (or b-axis) is oriented perpendicular to the substrate, has excellent performance. However, there is no disclosure of any specific process to obtain the good quality Bi-based oxide superconductor thin film whose c-axis is oriented parallel to the substrate and whose a-axis (or b-axis) is oriented perpendicular to the substrate.

SUMMARY OF THE INVENTION

Consequently, it is an object of the present invention to manufacture a well-crystallized and a-axis (or b-axis) oriented Bi-based oxide superconductor thin film, in order to obtain a high performance layered Josephson junction using a Bi-based oxide superconductor.

In a Bi-2223 thin film, an a-axis oriented Bi-2223 thin film is grown by a process where one unit cell of Bi-2223 is conformity with three units of either; a single crystal substrate of $LaSrAlO_4$ having a (110) plane, a single crystal substrate of $LaSrGaO_4$ having a (110) plane, a single crystal substrate of $\alpha$-$Al_2O_3$ having a (10-10) plane (a-plane), or a single crystal substrate of $NdAlO_3$ having a (10-10) plane (a-plane).

In a Bi-2201 thin film, an a-axis oriented Bi-2201 thin film is grown by a process where one unit cell of Bi-2201 is matched with two units of either; a single crystal substrate of either $LaSrAlO_4$ having a (110) plane, a single crystal substrate of $LaSrGaO_4$ having a (110) plane, a single crystal substrate of $\alpha$-$Al_2O_3$ having a (10-10) plane (a-plane), or a single crystal substrate of $NdAlO_3$ having a (10-10) plane (a-plane).

The lattice constant of a single crystal of the superconductor thin film is approximately integer times multiple of a lattice constant of a single crystal of the substrate.

Normally, when forming a film directly on a substrate at high temperature, a c-axis oriented Bi-2223 thin film or Bi-2201 thin film grows. However when forming a film at substrate temperatures between 500 and 600° C., a c-axis oriented film cannot be formed, and a well-crystallized a-axis oriented Bi-2223 or Bi-2201 thin film can be manufactured.

When manufacturing a Josephson device using a well-crystallized a-axis oriented Bi-based oxide superconductor thin film made by the method of the present application, it is possible to obtain a Josephson device of extremely high performance.

A method of manufacturing a Bi-based oxide superconductive film, which comprises the steps of depositing a $Bi_2Sr_2Ca_2Cu_3O_{10}$ (Bi-2223) oxide film by carrying out epitaxial growth of $Bi_2Sr_2Ca_2Cu_2O_{10}$ on a (110) crystal plane of a single crystal substrate of $LaSrAlO_4$ or on a (110) crystal plane of a single crystal substrate of $LasrGaO_4$, and crystal axis of the oxide film in which c-axis of the $Bia_2Sr_2Ca_2Cu_3O_{10}$ oxide is oriented in parallel to the said substrate and a- or b-axis is oriented in perpendicular to the substrate surface.

The Bi-based oxide superconductive film has been obtained by epitaxial growth of $Bi_2Sr_2Ca_2Cu_3O_{10\pm X}$ (Bi-2223) on a (110) crystal plane of a single crystal substrate of $LaSrAlO_4$ or on a (110) crystal plane of a single crystal substrate of $LaSrGaO_4$, for controlling orientation of the crystal planes such that c-axis of the $Bi_2Sr_2Ca_2Cu_3O_{10\pm X}$ (Bi-2223) oxide film is oriented parallel to the said substrate and a- or b-axis is oriented perpendicular to the substrate surface.

Furthermore, a Josephson device has been manufactured using a $Bi_2Sr_2Ca_2Cu_3O_{10\pm X}$ oxide superconductor thin film formed according to the above-described method exhibits superior performance.

DETAILED DESCRIPTION OF THE INVENTION

The most preferred embodiment according to the present invention will be described hereunder.

Figure 1:
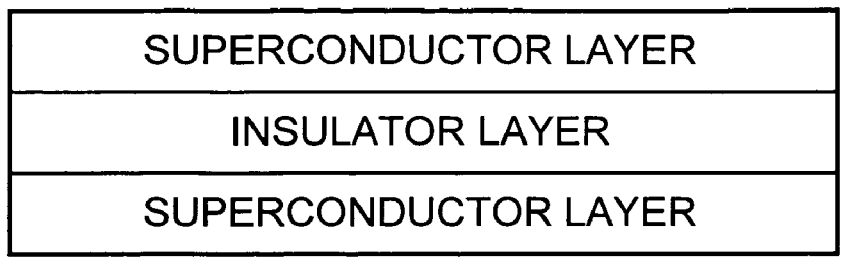
FIG. 1 is a promising example of a Josephson junction.
Figure 2:
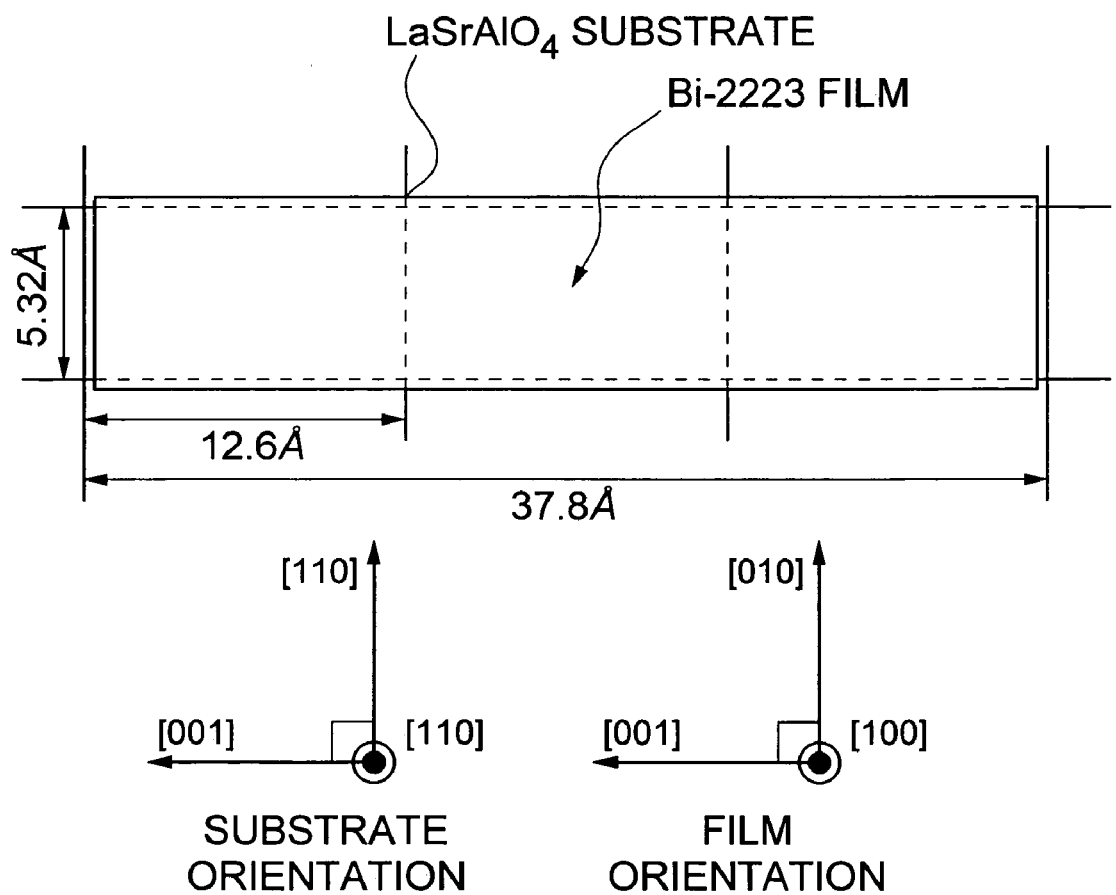
FIG. 2 is an explanatory drawing of a matching state.

FIG. 2 shows conformity of lattice constants of a (110) plane of a single crystal substrate of $LaSrAlO_4$ and lattice constants of a-axis oriented Bi-2223 formed thereon. As shown in FIG. 2, it is understood that one unit cell of Bi-2223 is in conformity with three unit cells of $LaSrAlO_4$ extremely well. It is also understood that the misfit of the lattice constants for the a-axis length (or b-axis length) and the c-axis length are −1.48% and 1.61%, respectively, which is extremely small.

Therefore, on a (110) $LaSrAlO_4$ single crystal substrate, a Bi-2223 thin film whose c-axis is oriented parallel to the substrate and whose a-axis (or b-axis) is oriented perpendicular to the substrate, can be formed by a heteroepitaxial growth process.

Moreover, it is clear from the conformity that, not a twin crystal film, but a high quality single crystal of B-2223 film with the c-axis of the Bi-2223 oriented in one direction on the substrate can be manufactured.

EXAMPLE 1

Figure 3:
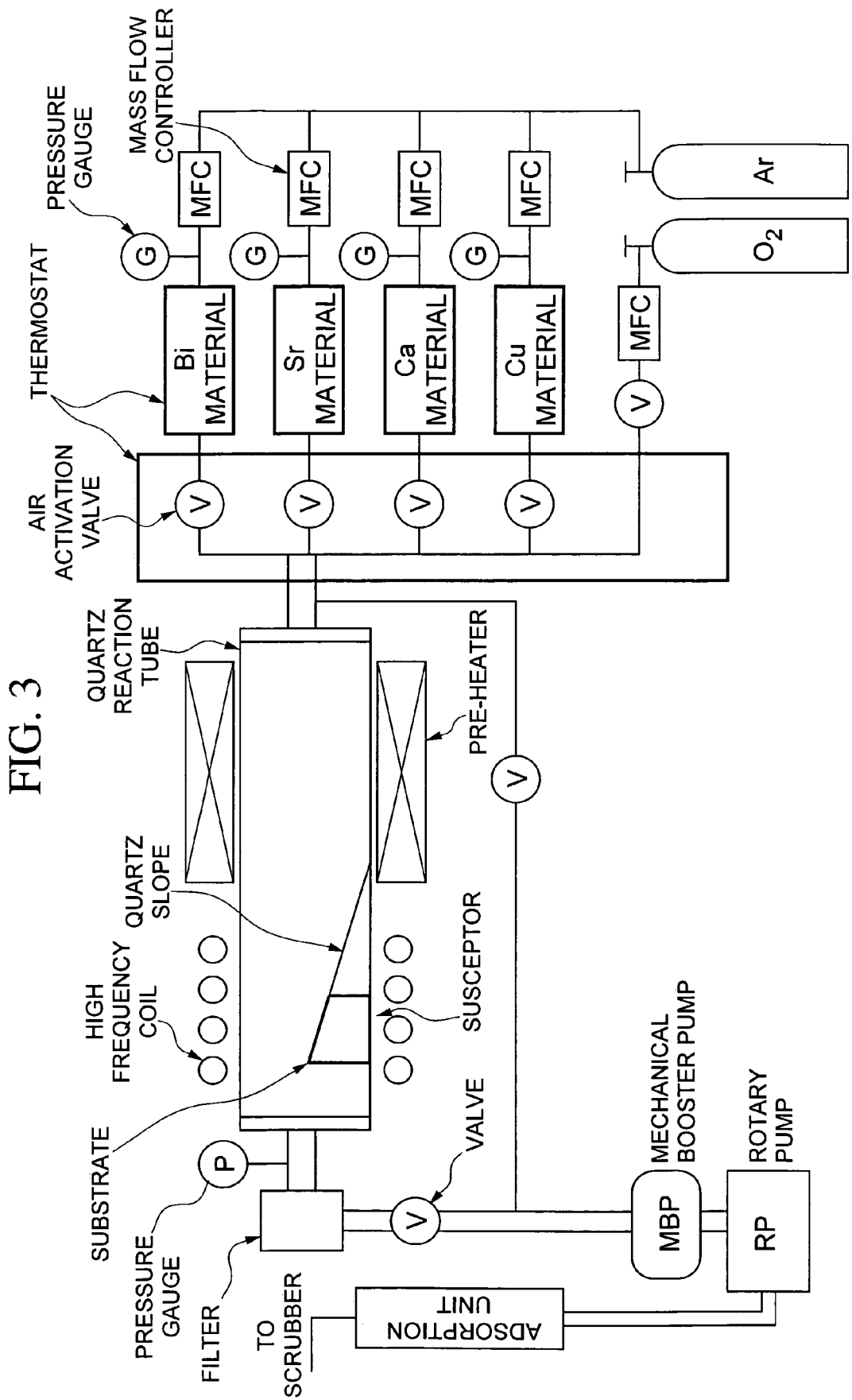
FIG. 3 is a conceptual drawing of an MOCVD thin film forming device.

Using (110) crystal plane of $LaSrAlO_4$ single crystal substrate, a well-crystallized a-axis oriented Bi-2223 superconductor thin film was manufactured by metal-organic chemical vapor deposition (MOCVD). The MOCVD device is shown in FIG. 3. The film was formed under the following conditions; $Bi(C_6H_5)_3$, $Sr(DPM)_2$, $Ca(DPM)_2$, and $Cu(DPM)_2$ (DPM: dipivaloylmethan) were used as metal-organic materials while each temperature was maintained at 72° C., 176° C., 161° C., and 80° C., respectively; the Ar carrier gas flow rate was 100, 300, 300, 70 sccm, respectively; the total pressure was 50 torr; the oxygen partial pressure was 23 torr; and the substrate temperature was 570° C.

Figure 4:
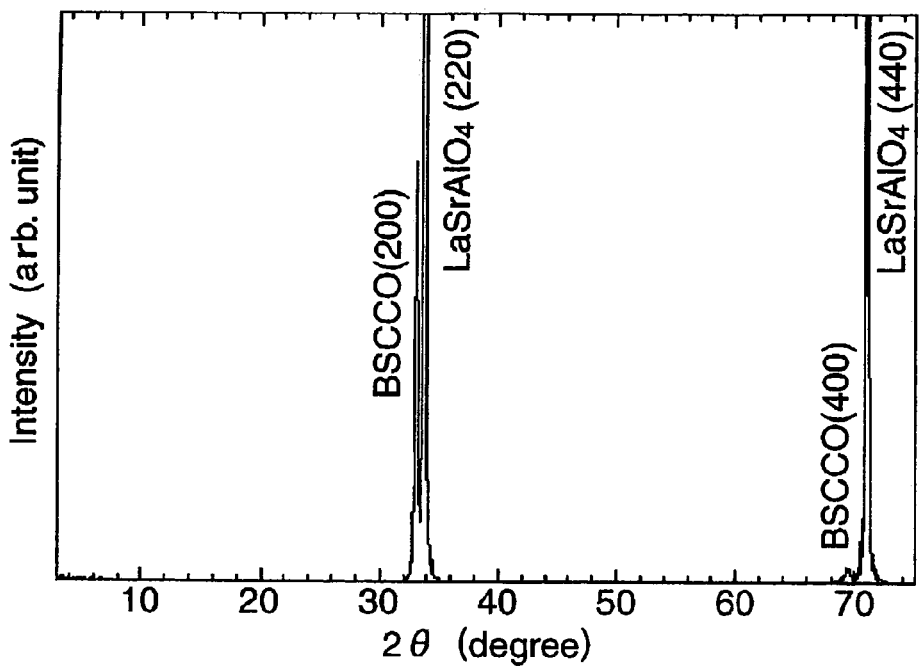
FIG. 4 shows a thin film X-ray diffraction patterns for epitaxially grown Bi-2223 film and $LaSrAlO_4$ substrate.

The obtained X-ray diffraction pattern is shown FIG. 4. As it is clear from the figure, all of the diffraction peaks except for the substrate can be identified as the (n00) or (0n0) plane of the Bi-2223. According to this, it is confirmed that a Bi-2223 thin film whose c-axis is oriented parallel to the substrate and whose a-axis (or b-axis) is oriented perpendicular to the substrate was manufactured.

Figure 5:
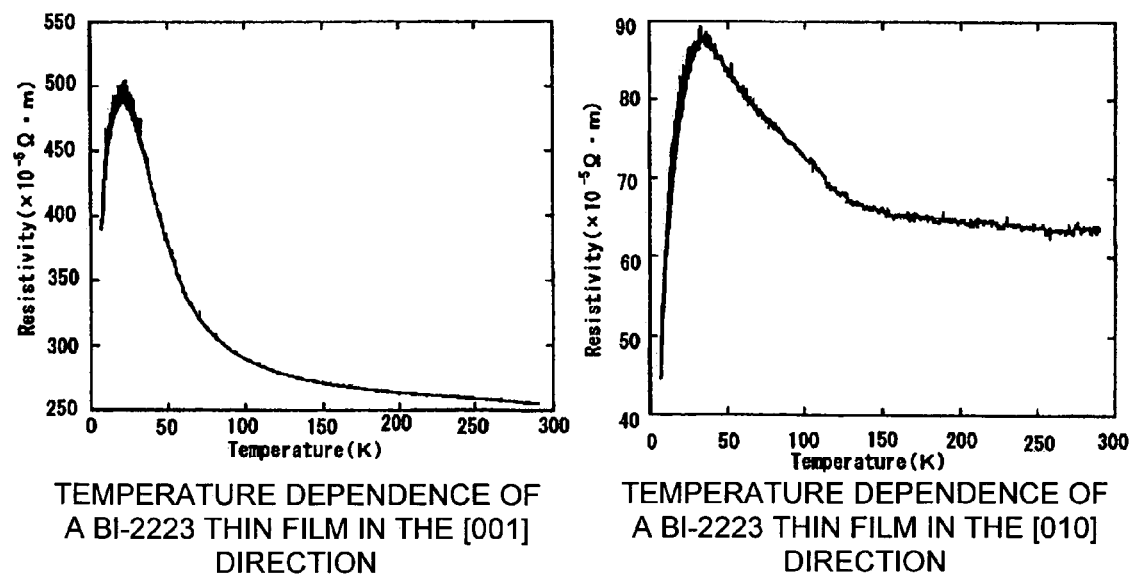
FIG. 5 shows temperature dependence of resistivity of an a-axis oriented Bi-2223 thin film.

FIG. 5 shows the temperature dependence of the resistivity of the manufactured a-axis oriented Bi-2223 thin film. Measurement was performed by the standard four terminal method.

Figure 6:
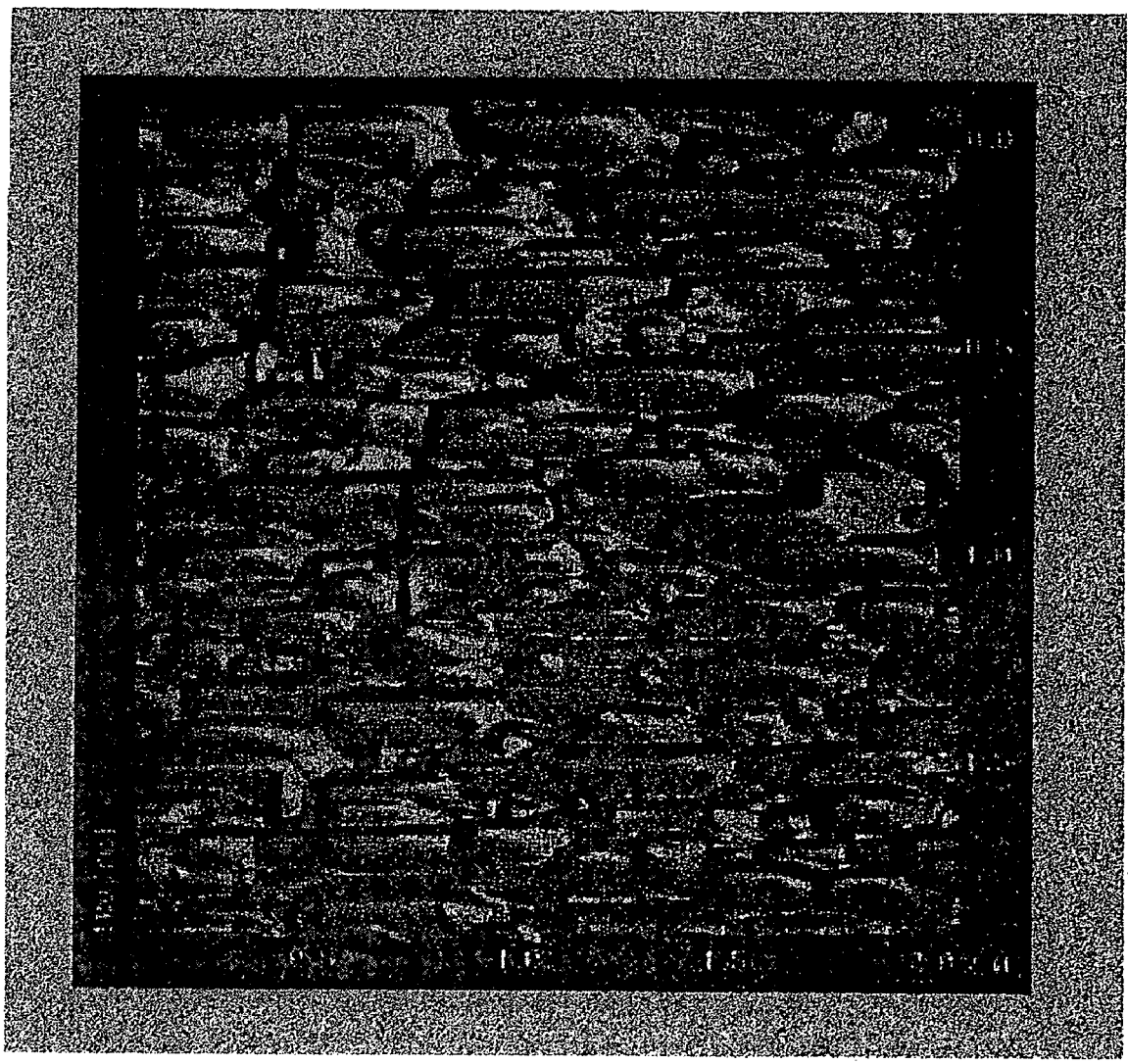
FIG. 6 shows an interatomic force microscope (AFM) image of a Bi-2223 thin film surface.
Figure 7:
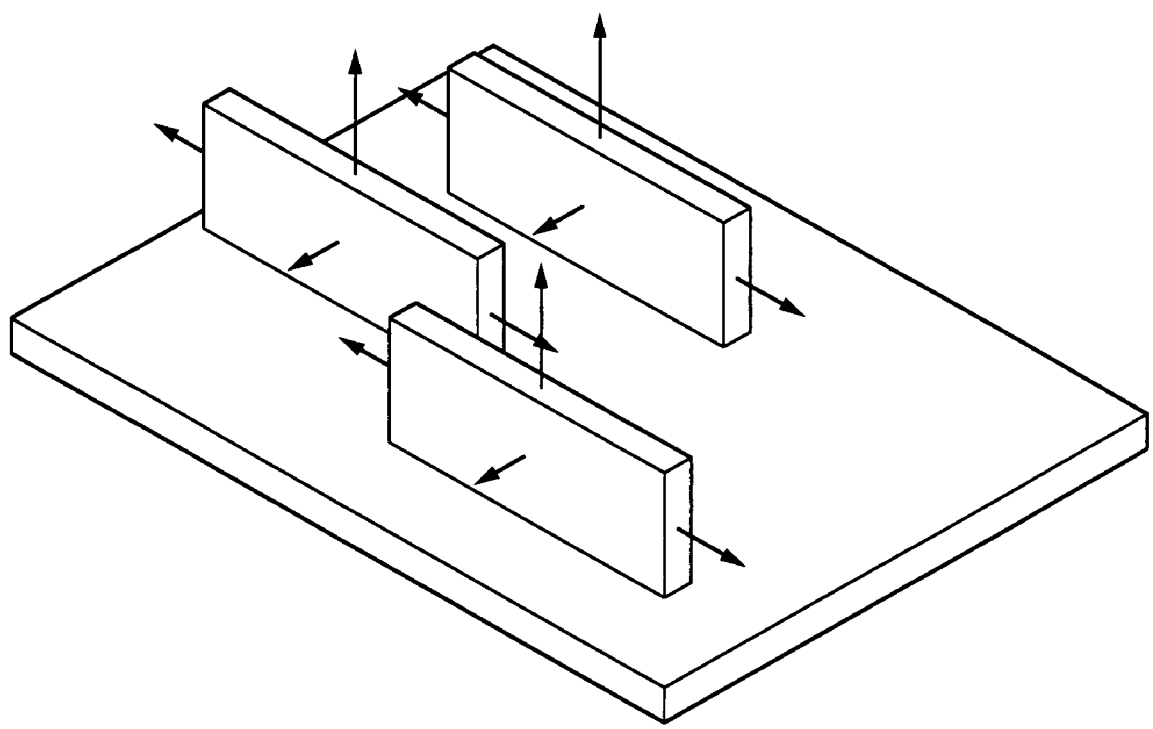
FIG. 7 is schematic drawing for explaining surface morphology.
Figure 7:
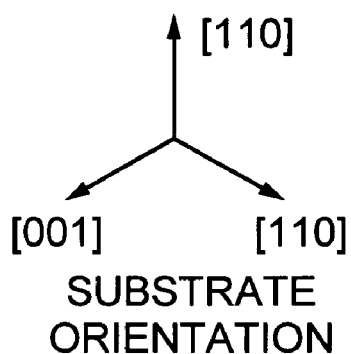
Figure 7:
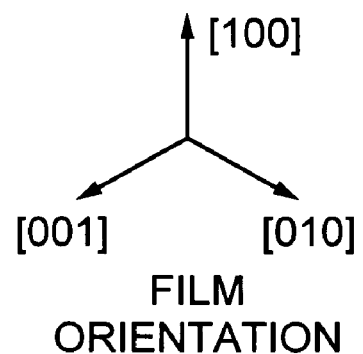

FIG. 6 shows an interatomic force microscope (AFM) image of the thin film surface. Bi-2223, according to its crystal structure, is expected to grow slowly in the c-axis direction and fast in the a- and b-axis directions (namely the c-plane), and if the growth proceeds by a two dimensional nucleus growth mechanism, it is expected to have a surface morphology as shown in the schematic drawing of FIG. 7.

The surface morphology of a practically obtained a-axis (or b-axis) oriented film proves this, and thus it is understood that the film was formed by a two dimensional nucleus growth mechanism. Moreover, it is understood that a high quality film was obtained without having a twin crystal and whose c-axis is grown uniformly along one direction.

As described above, by carrying out an epitaxial growth on a (110) crystal plane of $LaSrAlO_4$ single crystal substrate, lattice constants of which are well in conformity with a (100) or (010) plane of a Bi-2223 oxide superconductor, the Bi-2223 thin film whose c-axis is oriented and aligned in a parallel direction of the substrate, and whose a-axis (or b-axis) is oriented perpendicular to the substrate, was successfully manufactured for the first time in the world. In addition to the (110) crystal plane of the $LaSrO_4$ single crystal substrate, a (110) crystal plane of a $LaSrGa_4$ single crystal can be used for the substrate of epitaxial growth deposition for the oxide superconductor film.

Moreover, for this method, if the aforementioned substrate is used, film forming methods other than the MOCVD method, such as a sputtering method, a pulse laser deposition method (PLD method), or a reactive deposition method are also effective.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing a Bi-based oxide superconductor thin film having a c-axis parallel to a substrate surface on a substrate and one of an a-axis and b-axis being oriented perpendicular to the substrate surface on the substrate, the method comprising the steps of:
    depositing a (100) crystal plane of said oxide superconductor film on a (110) crystal plane of a single crystal substrate selected from the group consisting of $LaSrAlO_4$ and $LaSrGaO_4$ while heating the substrate at a temperature suitable for the depositing and supplying of oxygen, wherein
    a lattice constant of said (100) crystal plane of said superconductor thin film is approximately integer times multiple of a lattice constant of the (110) crystal plane of said substrate.

2. A method of manufacturing a Bi-based oxide superconductor thin film having a c-axis parallel to a substrate surface on a substrate and one of an a-axis and b-axis being oriented perpendicular to the substrate surface on a substrate thin film according to claim 1:
    wherein said oxide superconductor thin film has a composition of $Bi_2Sr_2Ca_2Cu_3O_{10\pm X}$ (where X is a positive number less than unity) or $Bi_2Sr_2CuO_{6\pm Y}$ (where Y is a positive number less than unity).

3. A method of manufacturing an oxide superconductor thin film according to claim 2, wherein the method comprises the steps of:
    mounting the substrate having a (110) crystal plane on the surface, in a deposition chamber and heating the substrate to a temperature of 570° C.;
    placing metal-organic chemical vapor deposition materials in the chamber and heating the materials at respective temperatures suitable for vapor deposition; and
    flowing a carrier gas with oxygen into the chamber and depositing a thin film of the Bi-based oxide superconductor having a c-axis parallel to the (110) crystal plane of the substrate surface and having one of an a-axis and b-axis oriented perpendicular to the substrate surface.

4. The method of claim 1, wherein the substrate is heated to a temperature between 500 to 600° C.

5. The method of claim 2, wherein the substrate is heated to a temperature between 500 to 600° C.

6. A method of manufacturing a $Bia_2Sr_2Ca_2Cu_3O_{10\pm X}$ (where X is a positive number less than unity) oxide superconductive film, wherein the $Bi_2Sr_2Ca_2Cu_3O_{10\pm X}$ superconductor oxide film is manufactured by carrying out epitaxial growth of $Bi_2Sr_2Ca_2Cu_3O_{10\pm X}$ on a (110) crystal plane of a single crystal substrate of $LaSrAlO_4$ or on a (110) crystal plane of a single crystal substrate of $LaSrGaO_4$, such that c-axis of the $Bi_2Sr_2Ca_2Cu_3O_{10}$ oxide is oriented in parallel to the said substrate and a-axis or b-axis is oriented in perpendicular to the substrate surface.

7. A $Bia_2Sr_2Ca_2Cu_3O_{10\pm X}$ (where X is a positive number less than unity) oxide superconductive film, obtained by epitaxial growth of $Bi_2Sr_2Ca_2Cu_2O_{10\pm X}$ on a (110) crystal plane of a single crystal substrate of $LaSrAlO_4$ or on a (110) crystal plane of a single crystal $LaSrGaO_4$, such that c-axis of the $Bia_2Sr_2Ca_2Cu_3O_{10\pm X}$ oxide film is oriented in parallel to the said substrate and a-axis or b-axis is oriented perpendicular to the substrate surface.

8. A Josephson device manufactured using a $Bi_2Sr_2Ca_2Cu_3O_{10\pm X}$ oxide superconductor thin film according to claim 7.

* * * * *